(12) United States Patent
Cheng et al.

(10) Patent No.: US 8,890,088 B2
(45) Date of Patent: Nov. 18, 2014

(54) LASER CAVITY TWO-PHOTON SPECTROSCOPY

(71) Applicant: National Central University, Taoyuan County (TW)

(72) Inventors: Wang-Yau Cheng, Hualein (TW); Chien-Ming Wu, New Taipei (TW); Tze-Wei Liu, Taipei (TW); You-Huan Chen, Kaohsiung (TW)

(73) Assignee: National Central University, Taoyuan County (TW)

( * ) Notice: Subject to any disclaimer, the term of this patent is extended or adjusted under 35 U.S.C. 154(b) by 121 days.

(21) Appl. No.: 13/733,878

(22) Filed: Jan. 3, 2013

(65) Prior Publication Data

US 2013/0175455 A1   Jul. 11, 2013

Related U.S. Application Data

(60) Provisional application No. 61/583,196, filed on Jan. 5, 2012.

(51) Int. Cl.
| | |
|---|---|
| *G01J 1/58* | (2006.01) |
| *G01J 3/44* | (2006.01) |
| *H01S 3/13* | (2006.01) |
| *H01S 5/024* | (2006.01) |
| *H01S 5/14* | (2006.01) |

(52) U.S. Cl.
CPC ............. *G01J 3/4406* (2013.01); *H01S 3/1303* (2013.01); *H01S 5/02446* (2013.01); *H01S 5/141* (2013.01); *H01S 5/02415* (2013.01)
USPC ..................................................... 250/458.1

(58) Field of Classification Search
USPC ..................................................... 250/458.1
See application file for complete search history.

(56) References Cited

U.S. PATENT DOCUMENTS

| | | | |
|---|---|---|---|
| 2008/0225907 A1* | 9/2008 | Diels et al. | 372/25 |
| 2010/0246610 A1* | 9/2010 | Mirov et al. | 372/10 |

OTHER PUBLICATIONS

Edwards C. S., Barwood G. P., Rowley W. R. C., Absolute Frequency Stablization of a 637 nm Laser Diode Using Doppler-freee I2 Spectra, Electron. Lett., 1995, 31, 796-797.
Wendell T. Hill III, Theodor W. Hansch, and Arthur L. Schawlow, Intracavity Absorption Line Profiles: a comment on the observed symmetry, Nov. 15, 1985, vol. 24, No. 22, Applied Optics, 3718-3724.

* cited by examiner

*Primary Examiner* — David Porta
*Assistant Examiner* — Hugh H Maupin
(74) *Attorney, Agent, or Firm* — CKC & Partners Co., Ltd.

(57) ABSTRACT

A laser cavity two-photon spectroscopy includes a gain medium, a first reflector, a second reflector, an electrical pumping module, and a two-photon absorption cell. The first reflector is disposed at a side of the gain medium. The second reflector is movably disposed at a side of the gain medium relative to the first reflector. The electrical pumping module is electrically connected to the gain medium. Therefore, the gain medium is able to emit a light beam, which bounces back and forth between the first reflector and the second reflector and forms a laser beam through enhanced by the gain medium. The two-photon absorption cell disposed between the gain medium and the second reflector includes a plurality of two-photon absorption mediums. The two-photon absorption mediums absorb a portion of the laser beam reflected between the first reflector and the second reflector and then emit fluorescence.

15 Claims, 10 Drawing Sheets

LASER CAVITY TWO-PHOTON SPECTROSCOPY

RELATED APPLICATIONS

This application claims priority to U.S. Provisional Patent Application Ser. No. 61/583,196, filed Jan. 5, 2012, which is herein incorporated by reference.

BACKGROUND

1. Technical Field

The present disclosure relates to a laser cavity two-photon spectroscopy.

2. Description of Related Art

High signal-to-noise spectra of direct two-photon transitions where one-photon detuning is far from the intermediate state is resolved with difficulty using a low-power 100 kHz linewidth laser. Taking cesium/rubidium atom two-photon transitions as examples, people have employed a high-power Ti:sapphire laser, cavity-enhanced scheme, or a tapered amplifier to boost the laser power in order to improve the spectral signal-to-noise ratio (SNR). However, these methods necessitate increased complexity or cost.

SUMMARY

A laser cavity two-photon spectroscopy includes a gain medium, a first reflector, a second reflector, an electrical pumping module, and a two-photon absorption cell. The first reflector is disposed at a side of the gain medium. The second reflector is movably disposed at a side of the gain medium relative to the first reflector. The electrical pumping module is electrically connected to the gain medium, such that the gain medium is able to emit a light beam, and the light beam bounces back and forth between the first reflector and the second reflector and forms a laser beam through enhanced by the gain medium. The two-photon absorption cell is disposed between the gain medium and the second reflector. The two-photon absorption cell includes a plurality of two-photon absorption mediums. The two-photon absorption mediums absorb a portion of the laser beam reflected between the first reflector and the second reflector and then emit fluorescence.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
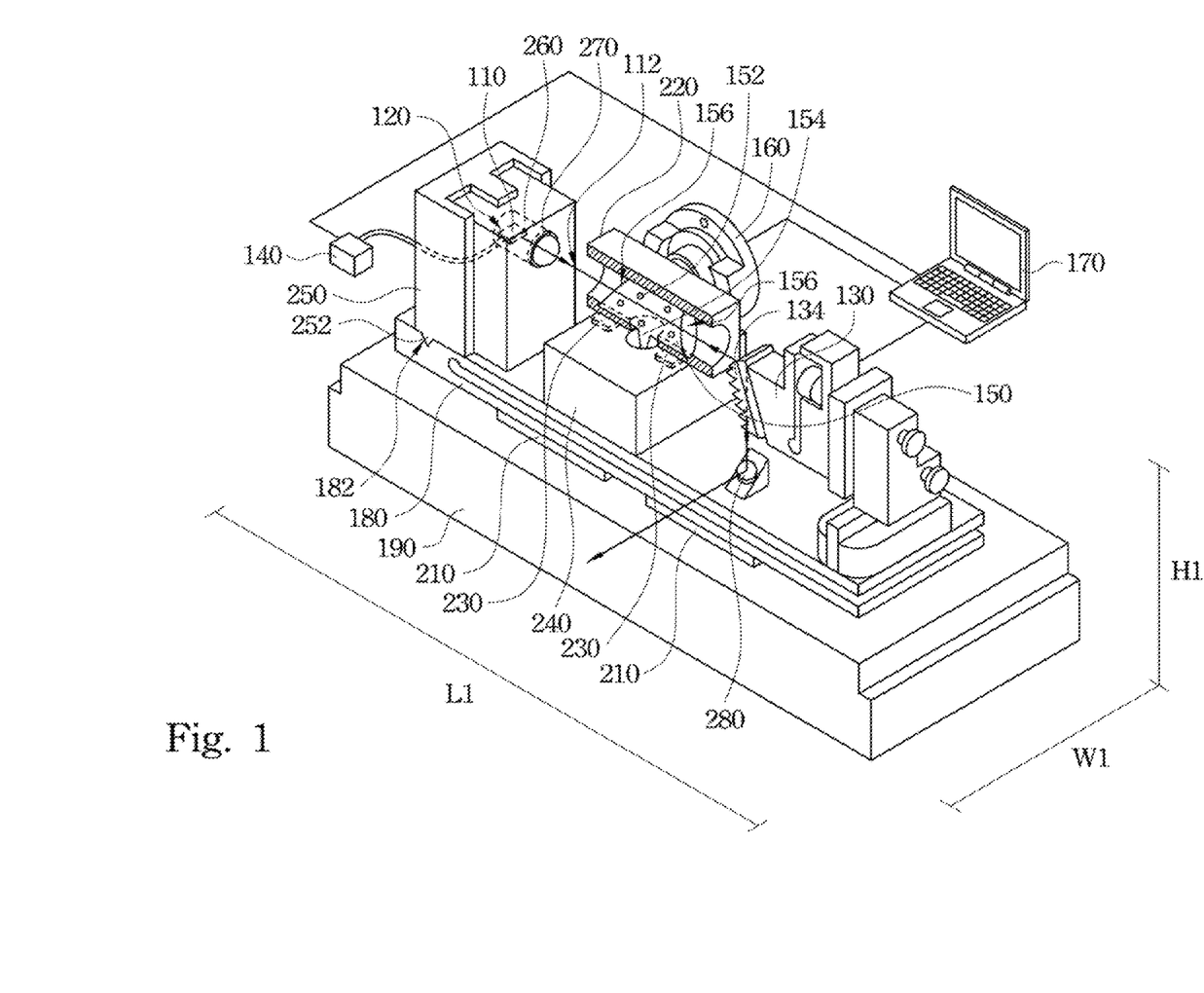
FIG. 1 is a schematic diagram of a laser cavity two-photon spectroscopy according to one embodiment of the present invention.

FIG. 1 is a schematic diagram of a laser cavity two-photon spectroscopy according to one embodiment of the present invention. A laser cavity two-photon spectroscopy includes a gain medium 110, a first reflector 120, a second reflector 130, an electrical pumping module 140, and a two-photon absorption cell 150. The first reflector 120 is disposed at a side of the gain medium 110. The second reflector 130 is movably disposed at a side of the gain medium 110 relative to the first reflector 120. The electrical pumping module 140 is electrically connected to the gain medium 110, such that the gain medium 110 is able to emit a light beam. The light beam bounces back and forth between the first reflector 120 and the second reflector 130 and forms a laser beam 112 through enhanced by the gain medium 110. The two-photon absorption cell 150 is disposed between the gain medium 110 and the second reflector 130. The two-photon absorption cell 150 includes a plurality of two-photon absorption mediums 152. The two-photon absorption mediums 152 absorb a portion of the laser beam 112 reflected between the first reflector 120 and the second reflector 130 and then emit fluorescence.

A space between the first reflector 120 and the second reflector 130 not only functions as a laser cavity, which is a cavity the light beam forms the laser beam 112, but also accommodates the two-photon absorption cell 150. The two-photon absorption mediums 152 absorb the laser beam 112 respectively incident to the two-photon absorption cell 150 from the first reflector 120 and the second reflector 130 and emit fluorescence. Since the absorption efficiency is substantially weak, even thought the two-photon absorption mediums 152 absorb the laser beam 112 and emit fluorescence, the two-photon absorption mediums 152 absorbed the laser beam 112 do not effect the physical properties, such as refractive index, of the laser cavity. Therefore, the physical properties, such as the frequency, of the laser beam 112 are not affected. In addition, for a laser device, there are about 90% laser power of the laser beam is reflected in the laser cavity, and only 10% laser power of the laser beam emerges the laser device. Hence, the two-photon absorption cell 150 disposed in the laser cavity, i.e. the space between the first reflector 120 and the second reflector 130 in the present embodiment, meets higher laser power. On the other hand, since the lasing of the laser cavity two-photon spectroscopy is obtained under high overlapping optical paths the laser beam 112 reflected respectively from the first reflector 120 and the second reflector 130, the lasing guarantees Doppler free of the two-photon absorption mediums 152. Moreover, since the two-photon absorption cell 150 is disposed in the laser cavity, the whole size of the laser cavity two-photon spectroscopy can be compacted, such as hand-sized. Thus, the cost of the laser cavity two-photon spectroscopy can be cost down, and it is convenience to move the whole laser cavity two-photon spectroscopy without any optical alignment.

Figure 2:
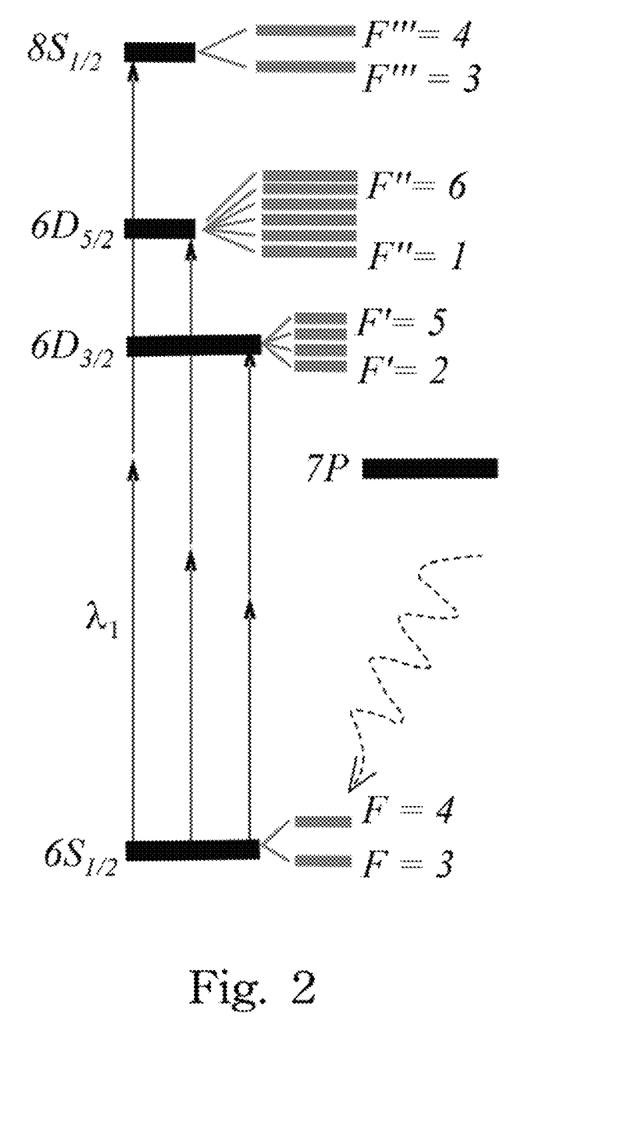
FIG. 2 is a level diagram of the cesium (Cs) atoms.

FIG. 2 is a level diagram of the cesium (Cs) atoms. In one or more embodiments, the two-photon absorption mediums 152 may be Cs atoms. Taking the 133Cs 6S(1/2)→8S(1/2) hyperfine transmission of Cs atoms as an example. There are two states at the 6S(1/2) level, namely, F=3 and F=4, and two states at the 8S(1/2) level, namely, F'''=3 and F'''=4. An electron in the 6S(1/2) orbit (F=3 or F=4 state) absorbs two photons and transmits to the 8S(1/2) orbit (F'''=3 or F'''=4 state). The electron then transmits to 7P orbit and emits fluorescence through relaxing back to 6S(1/2) orbit. The wavelength of the two photons is 822 nm, and the wavelengths of the fluorescence are 495.3 nm for F=3 state and 455.4 nm for F=4 state. However, Cs atoms are only illustrative, and should not limit the scope of the present invention. In one or more embodiments, the two-photon absorption mediums 152 may be alkali atoms, such as rubidium (Rb) or magnesium (Mg), and so on. As the type of the two-photon atoms is chosen, the gain medium 110 can be chosen to emit a laser beam with a frequency absorbed by the chosen two-photon atoms.

Reference is made back to FIG. 1. The second reflector 130 may include a grating 134 which is properly oriented so that most of the laser power can be diffracted back to the laser cavity for the wavelength of the laser beam 112. The gain medium 120 may be a diode laser, and hence the first reflector 120 is an end face of the diode laser. Since the output laser beam of the diode laser may be polarized, the two-photon absorption cell 150 can include two Brewster windows 156 for reducing the light loss from the two-photon absorption cell 150 according to the orientation of the polarization, and the orientation of the grating 134 is also setup for matching the polarization of the laser beam as shown in FIG. 1. In this case, a reflective mirror 280 may be included in the laser cavity two-photon spectroscopy to guiding the portion of the laser beam 112 are not diffracted back to the laser cavity outside the laser cavity two-photon spectroscopy.

The stabilization of the gain medium 110 (the diode laser in the present embodiment) is important. The diode laser sensitive to its temperature, which depends on the surrounding temperature, the temperature controlling system, and the temperature sensor device, etc. If the temperature of the diode laser is fluctuated, the frequency or the output power of the laser beam can not be stable which makes the data of the laser cavity two-photon spectroscopy unreliable. Taking Cs atoms for example, the working temperature of two-photon absorption of Cs atoms is about at 100° C., while the working temperature of the diode laser is about at 20° C., and it causes a big issue that how to individually stabilizes the two-photon absorption cell 150 and the diode laser at their working temperatures in the laser cavity two-photon spectroscopy.

In one or more embodiments, the laser cavity two-photon spectroscopy may further include at least one first temperature controlling device 210, a thermal conductor 220, at least one second temperature controlling device 230, and a thermal isolation bulk 240. The first temperature controlling device 210 is utilized for controlling a temperature of the gain medium 110. The thermal conductor 220 is disposed around the two-photon absorption cell 150, and the second temperature controlling device 230 is attached to the thermal conductor 220 for controlling a temperature of the two-photon absorption cell 150. The thermal isolation bulk 240 is disposed between the thermal conductor 220 and the first temperature controlling device 210 for isolating the temperatures of the first temperature controlling device 210 and the second temperature controlling device 230. Furthermore, the laser cavity two-photon spectroscopy can further include a thermal reservoir 190 disposed on a side of the first temperature controlling device 210 for maintaining the temperature of the laser cavity two-photon spectroscopy.

In the present embodiment, two second temperature controlling devices 230 are attached to the thermal conductor 220. It should be noticed that a portion of the thermal conductor 220 has been removed in FIG. 1 to show the two-photon absorption cell 150 and the second temperature controlling devices 230 for clarify. A cold finger 154 of the two-photon absorption cell 150 is disposed between the two second temperature controlling devices 230, such that the two second temperature controlling devices 230 can control the vapor pressure of Cs atoms in the two-photon absorption cell 150 through the cold finger 154. Two first temperature controlling devices 210 are disposed on the thermal reservoir 190, and the heat generated from the two first temperature controlling devices 210 can transfer to the diode laser (the gain medium 110). The thermal isolation bulk 240 is disposed between the first temperature controlling devices 210 and the second thermal conductor 220 for isolating the heats generated from the first temperature controlling devices 210 and the second temperature controlling devices 230. Therefore, the two-photon absorption cell 150 and the gain medium 110 can be at different temperatures and work well respectively.

In one or more embodiments, the first temperature controlling device 210 may be a thermoelectric cooler (TE cooler). In the present embodiment, the working temperature of the diode laser is at 20° C., the cooling side of the TE cooler can be thermally connected to the diode laser, while the heating side of the TE cooler is attached to the thermal reservoir 190, such that the temperature of the diode laser can be cooled to 20° C. (lower than the room temperature 25° C.), and the unwanted heat generated from the TE cooler can transfer to the thermal reservoir 190 simultaneously. However, in the other embodiments, if the room temperature is lower than the working temperature of the gain medium 110, the heating side of the TE cooler can be thermally connected to the gain medium, and the cooling side of the TE cooler can be attached to the thermal reservoir 250. The thermal conductor 220 may be made of capper. The second temperature controlling device 230 may be a thermal sensitive resistance. On the other hand, since two sides of the thermal isolation bulk 240 are at the temperature of the two-photon absorption cell 150 and at the temperature of the gain medium 110, respectively, the temperature gradient between the two sides should be considered. In one or more embodiments, the thermal isolation bulk 240 may be made of Polytetrafluoroethylene (PTFE, as known as Teflon) which owns a wide usable temperature range, low thermal conducting coefficient ($6 \times 10^4$ Cal/cm-.sec.° C.), excellent chemical stability, and good wear-resisting. The Teflon can smooth the temperature gradient between the two sides with different temperature. Therefore, both of the temperatures of the two-photon absorption cell 150 and the gain medium 110 can be more stabilized. However, the types of the first temperature controlling device 210 and the second temperature controlling device 230, and the materials of the thermal conductor 220 and the thermal isolation bulk 240 are only illustrative, and should not limit the scope of the present invention. The person having ordinary skill in the art may choose the types of the first temperature controlling device 210 and the second temperature controlling device 230, and the materials of the thermal conductor 220 and the thermal isolation bulk 240 according to actual requirements.

A heating method can be applied to the laser cavity two-photon spectroscopy in the present embodiment. The gain medium 110 and the two-photon absorption cell 150 are thermal isolated. The temperature of the gain medium 110 is first controlled to at a first temperature, i.e. 20° C. in the present embodiment. At the same time, the temperature of the two-photon absorption cell 150 is heated to a third temperature higher than the first temperature. The third temperature may be 40° C. in the present embodiment. The gain medium 110 is then electrical pumped to emit the laser beam by using the electrical pumping module 140 when the gain medium 110 is in thermal equilibrium After the laser output is stabilized, the two-photon absorption cell 150 can be further heated to a second temperature, i.e. 100° C. in the present embodiment, and the heating process is completed.

In one or more embodiments, the laser cavity two-photon spectroscopy may further include a damping substrate 180, a gain medium holder 250 with a bump 252, a collimation tube 260, and a first lens 270. The damping substrate 180 is for bearing the gain medium 110, the first reflector 120, the second reflector 130, and the two-photon absorption cell 150. The damping substrate 180 can absorb the environment oscillations and make the gain medium 110, the first reflector 120, the second reflector 130, and the two-photon absorption cell 150 more stable. The gain medium 110 is disposed in the collimation tube 260, and the collimation tube 260 is disposed in the gain medium holder 250. The first lens 270 is disposed in the collimation tube 260 and between the gain medium 110 and the two-photon absorption cell 150 for focusing the laser beam 112 reflected from the first reflector 120 into the two-photon absorption cell 150. The damping substrate 180 has a groove 182, which is able to couple to the bump 252, such that the gain medium 110 can be fixed relative to the damping substrate 180, and the movement of the gain medium 110 can be prevented.

Figure 3:
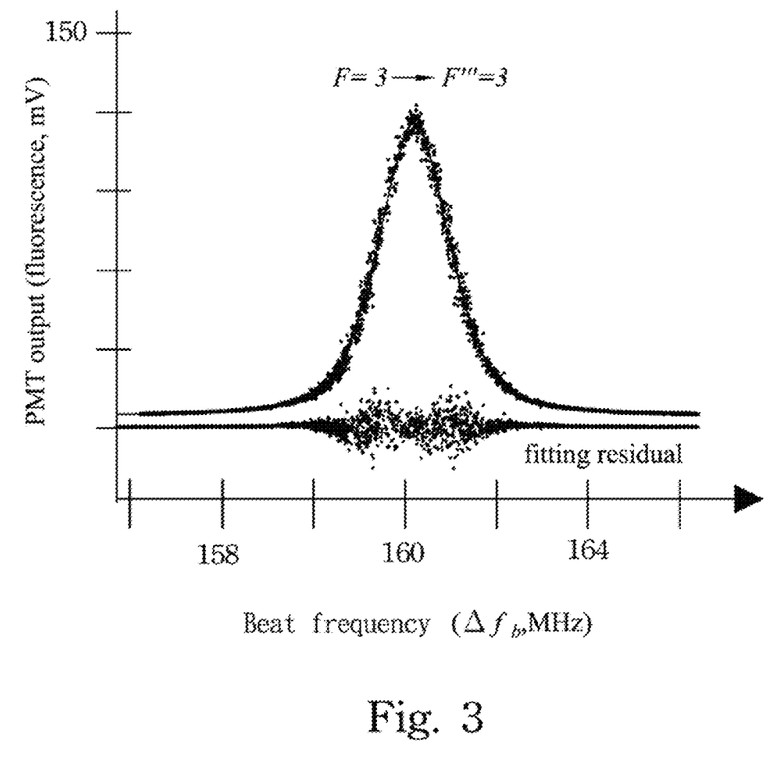
FIG. 3 is an absorption spectrum of Cs atoms 6S(1/2)→8S(1/2) (F=3→F'''=3) hyperfine transmission measured using the laser cavity two-photon spectroscopy of FIG. 1.

FIG. 3 is an absorption spectrum of Cs atoms 6S(1/2)→8S (1/2) (F=3→F'''=3) hyperfine transmission measured using the laser cavity two-photon spectroscopy of FIG. 1. The size (L1×W1×H1) of the laser cavity two-photon spectroscopy was 17.5×8×6.5 cm$^3$. The gain medium was an 822 nm Ti:sapphire diode laser (Fabry-Perot type) with 100 mW output power, and the first reflector was an end face of the diode laser. The grating of the second reflector was with 1800 groove/mm, and about 95% of laser power could be diffracted back to the laser cavity. The laser power inside the laser cavity was estimated as 40 mW. The two-photon absorption mediums were Cs atoms. The temperatures of the diode laser and the two-photon absorption cell were 23° C. and 100° C., respectively, and all within a range of 1 mK temperature instability. The power intensity inside the two-photon absorption cell was about 40 mW/mm$^2$. The absorption signal of Cs atoms was collected by using a photomultiplier tube (PMT). The frequency of F''=6 transition (as shown in FIG. 2) was chosen for the frequency axis reference of F=3→F'''=3 transition. A 160 MHz frequency difference was from a frequency bridge by a double-pass acoustic-optical modulator system. For studying the possible influence of laser cavity on the lineshape symmetry, a symmetry function (Voigt) was employed to fit the isolated 6S→8S transition, since it is about 4 GHz away from the nearby transition. The fitting residuals show a highly symmetric structure, which is a sufficient condition to show the symmetry of the experimental lineshape. It represents a slight influence of laser cavity on the two-photon transition. The hyperfine interval fitting is 1 order of magnitude better than previous work. The major factors for the weak influences on lineshape symmetry are attributed to the flat laser gain profile, gas-lensing free and mode pulling free (within the measurement precision). The details of the mode pulling free are discussed in the following paragraphs.

Reference is made back to FIG. 1. The laser cavity two-photon spectroscopy in the present embodiment can be applied to many fields, such as a Cs atoms clock calibration, or the frequency calibration of a frequency stabilized laser, and so on. For the frequency of the frequency stabilized laser calibration, the laser cavity two-photon spectroscopy may function as the frequency stabilized laser having a frequency calibration system. Although there are about 90% laser power is inside the laser cavity, there are still about 10% laser power can leave the laser cavity and become the output laser beam of the frequency stabilized laser. The laser cavity two-photon spectroscopy in FIG. 1 may further include a light-collecting device 160 and a feedback module 170. The light-collecting device 160 is for collecting the fluorescence and analyzing the intensity of the fluorescence. The feedback module 170 is electrically connected to the second reflector 130 and/or the electrically pumping device 140 for tuning the frequency of the laser beam according to the fluorescence signal. Therefore, the two-photon absorption cell 150, the light-collecting device 160, and the feedback module 170 can be the frequency calibration system of the frequency stabilized laser.

In specifically, when the frequency of the laser beam 112 is around 822 nm, the two-photon absorption mediums 152 can absorb the laser beam 112 and emit fluorescence. The light-collecting device 160 collects the fluorescence and gets an absorption spectrum. The intensity of the fluorescence is demodulated to be a first derivative signal. The feedback module 170 is then tuning the frequency of the laser beam 112 according to the first derivative signal. The frequency of the laser beam 112 is not locked until the frequency of the laser beam 112 matches the absorption frequency of the two-photon transition. On the other hand, to collect higher intensity of the fluorescence, an inner wall of an entrance of the light-collecting device 160 may be coated a reflecting layer, such that the fluorescence can be reflected into the light-collecting device 160 more efficiently. By using the laser cavity two-photon spectroscopy in the present embodiment, the absorption frequency of Cs F=3→F'''=3 is measured as 364507238347.2 (±4.0) kHz, and the absorption frequency of Cs F=4→F'''=4 is measured as 364503080281.2 (±4.0) kHz.

Figure 4:
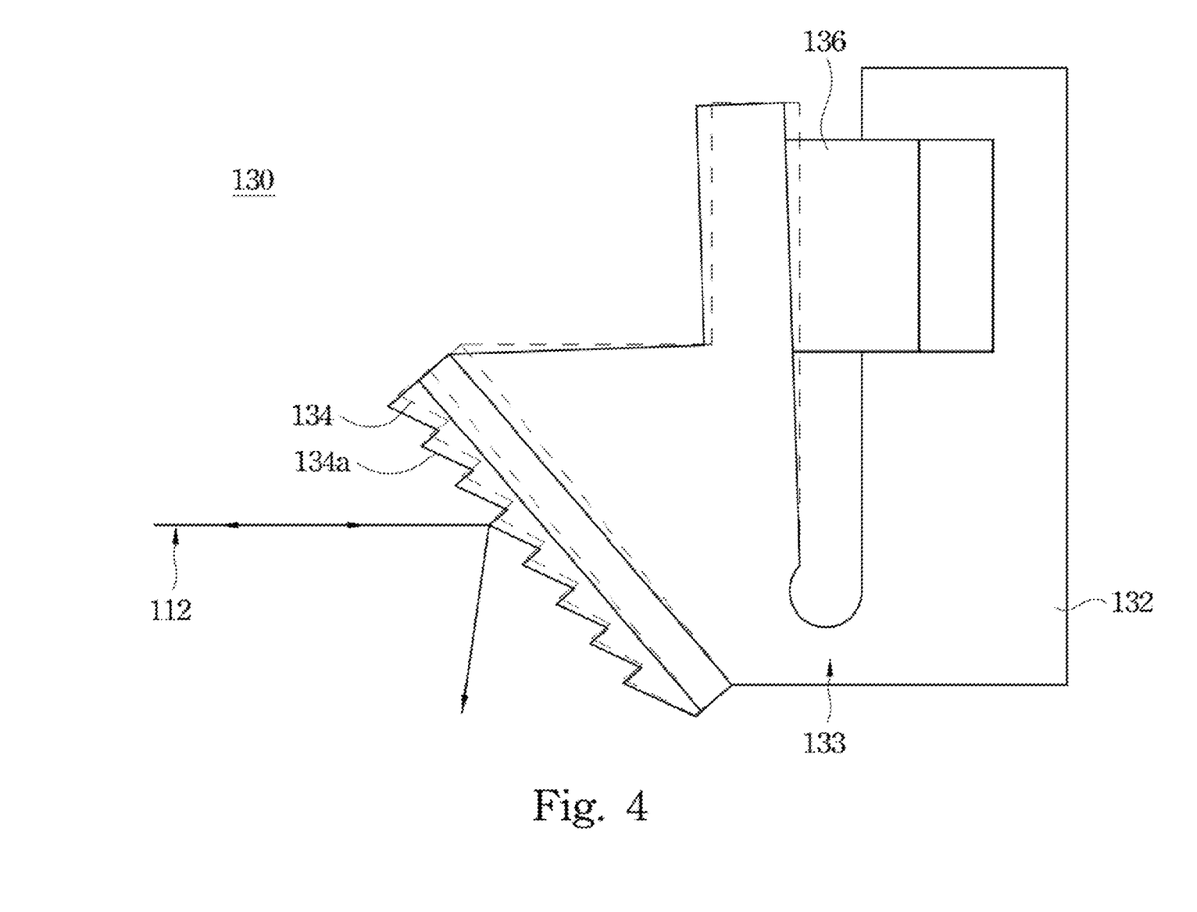
FIG. 4 is a schematic diagram of the second reflector in FIG. 1.

FIG. 4 is a schematic diagram of the second reflector 130 in FIG. 1. In one or more embodiments, the feedback module 170 in FIG. 1 can feedback the frequency tuning signal to the second reflector 130. The second reflector 130 includes a base 132, the grating 134, and a piezo-electric material 136. The base has a pivot 133, and the grating 134 is fixed to the base 132. The piezo-electric material 136 is disposed in the base 132 and electrically connected to the feed back module 170 in FIG. 1 for turning the grating 134 relative to the base 132. The laser beam 112 is incident to and reflected from the grating 134. For tuning the frequency of the laser beam 112, the feedback module 170 provides voltage to the piezo-electric material 136. Therefore, the length of the piezo-electric material 136 is changed, i.e. the length is longer as shown in FIG. 4 for example. The size-changed piezo-electric material 136 then push the base 132 along the pivot 133, and the angle and the position of the grating 134 are both changed to be grating 134a to tune the frequency of the laser beam 112. It should be understood, the structure of the second reflector 130 with the size-unchanged piezo-electric material 136 is shown as dashed lines in FIG. 9, while the structure of the second reflector 130 with the size-changed piezo-electric material 136 is shown as solid lines in FIG. 9 for clarity.

Reference is made back to FIG. 1. On the other hand, the frequency of the laser beam 112 can be tuned by changing the driving current of the gain medium 110. In specifically, the feedback module 170 may apply the frequency tuning signal to the electrical pumping module 140 for tuning the driving current of the gain medium 110. Since the reflective index of the gain medium 110 is slightly changed under different driving currents, the frequency of the laser beam 112 is also tuned by applying different driving currents. It should be understood that the frequency of the laser beam 112 can be tuned by tuning both or either the driving current and the current of the piezo-electric material in FIG. 4.

Figure 5:
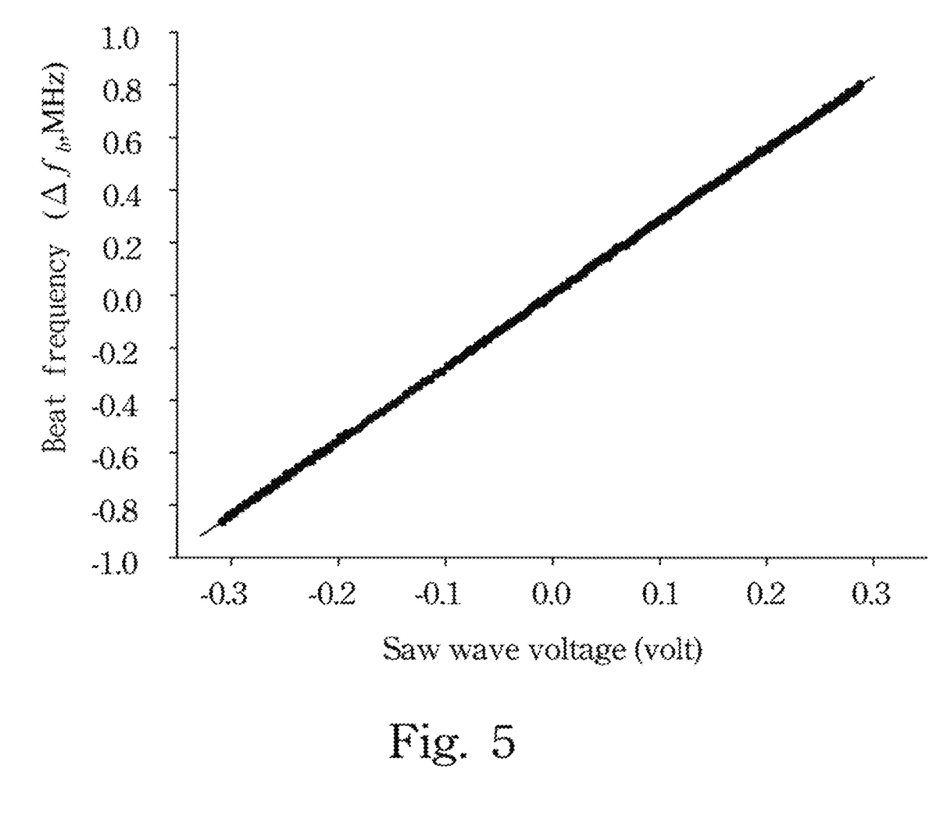
FIG. 5 is a graph of the driving voltages versus frequencies of the laser beam in FIG. 1 according to one example.
Figure 6:
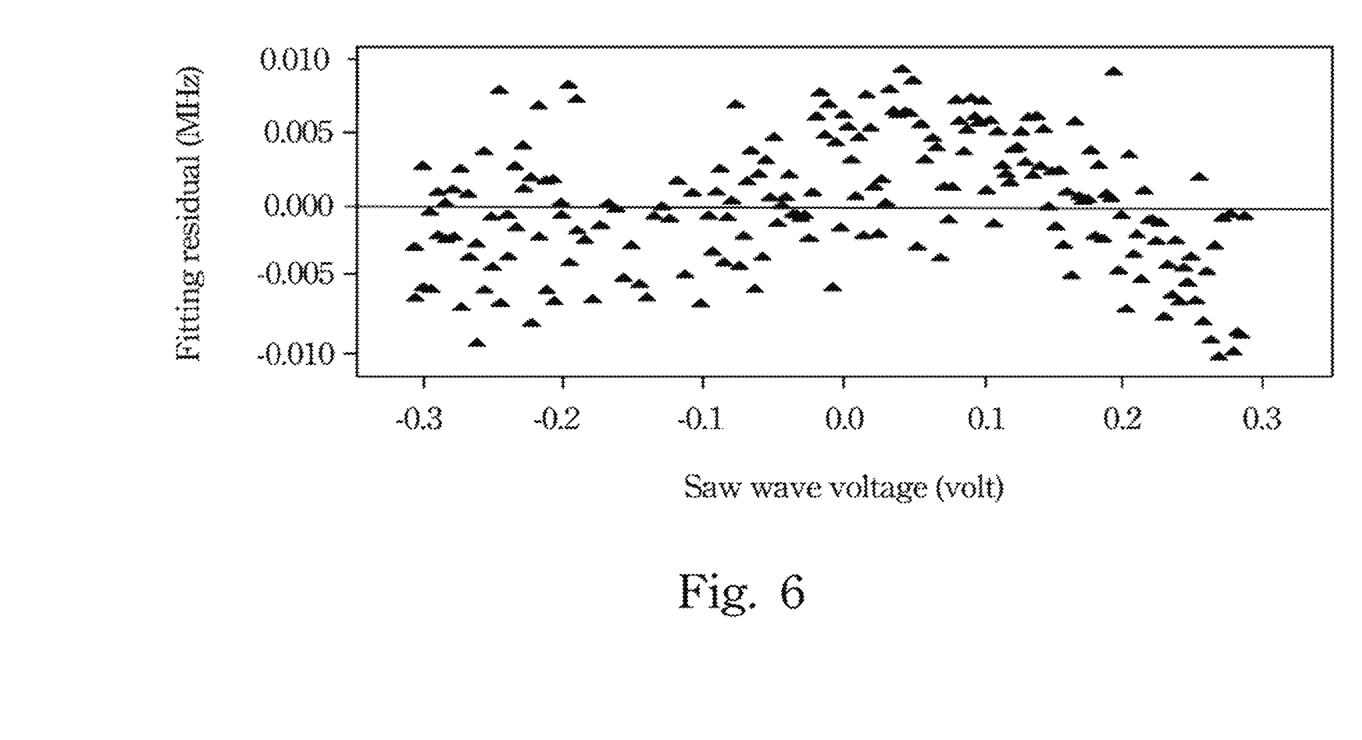
FIG. 6 is a graph of the fitting residual of the data points in FIG. 5.

Reference are made to FIG. 5 and FIG. 6. FIG. 5 is a graph of driving voltages versus frequencies of the laser beam 112 in FIG. 1 according to one example, and FIG. 6 is a graph of the fitting residual of the data points in FIG. 5. The feedback module provides different driving voltages to the piezo-electric material. The size (L1×W1×H1) of the laser cavity two-photon spectroscopy was $17.5 \times 8 \times 6.5$ cm$^3$. The gain medium was an 822 nm Ti:sapphire diode laser (Fabry-Perot type) with 100 mW output power, and the first reflector was an to edge of the diode laser. The grating of the second reflector was with 1800 groove/mm, and about 95% of laser power could be diffracted back to the laser cavity. The laser power inside the laser cavity was estimated as 40 mW. The two-photon absorption mediums were Cs atoms. The temperatures of the diode laser and the two-photon absorption cell were 23° C. and 100° C., respectively, and all within a range of 1 mK temperature instability. The power intensity inside the two-photon absorption cell was about 40 mW/mm$^2$. As mentioned above, the mode pulling effect is a troublesome issue and was inspected here by observing the possible lead-lag of the laser frequency. Laser frequency lead-lag, caused by the dispersion of the gain/absorption medium, is non-linearly dependent on the physical length of the laser resonator. To observe the mode pulling effect caused by two-photon absorption, a beat frequency $\Delta f_b$ was recorded synchronously with each saw-wave voltage applied to the piezo-electric material, because $\Delta f_b$ is related to the cavity optical length and the saw-wave voltage is related to the physical length. This was done by imposing a constant-frequency saw wave (10 mHz) to change the offset point of the piezo-electric material feedback loop while the laser frequency locking was kept engaged. The maximum voltage of saw wave was 0.3 V. FIG. 5 illustrates the response of laser frequency ($\Delta f_b$) versus each cavity-length changing, i.e. controlled by the saw-wave voltage. The data points were fitted linearly, and the fitting residual was within the frequency instability (10 kHz) when the laser frequency was detuned, which means the nonlinear mode pulling effect was not observed within 10 kHz measurement uncertainty. On the other hand, to directly observe the possible gas-lensing to effect, which may vary the laser output power and the laser beam size, the laser output power and the laser beam size were compared when the laser was frequency-stabilized to, or detuned far from the two-photon transition. The data showed no evidence of any lensing effect—within the power measurement uncertainty of 10 μW and size measurement uncertainty of 0.05 mm.

Figure 7:
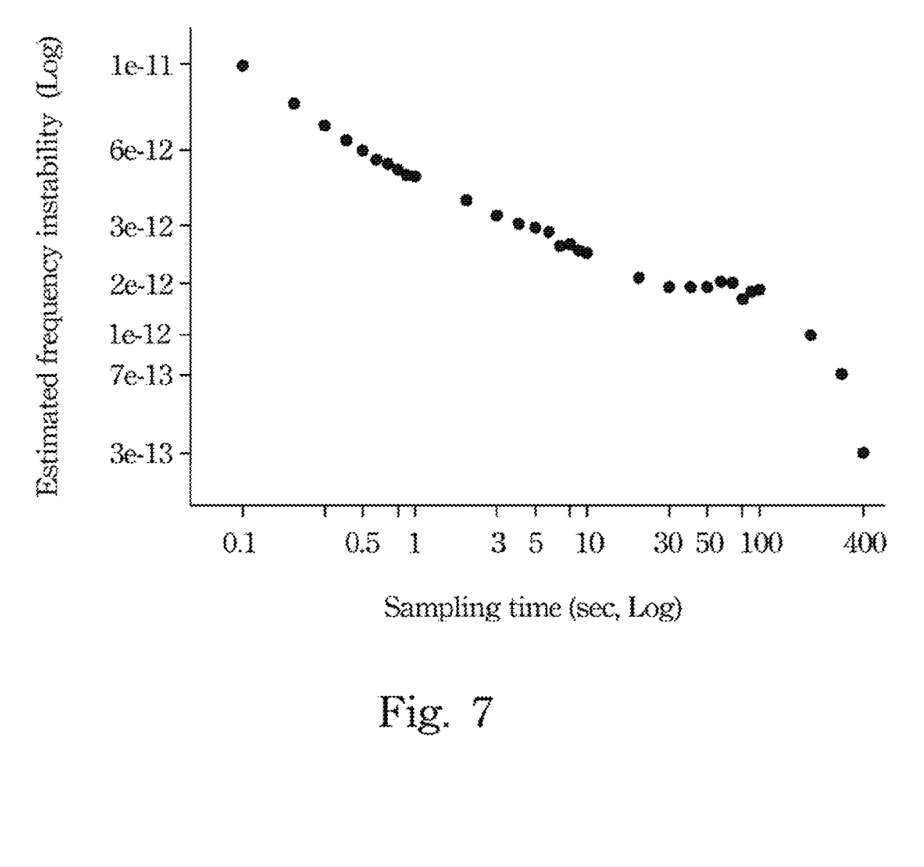
FIG. 7 is a graph of the sampling time versus the estimated frequency intensity of the laser cavity two-photon spectroscopy of FIG. 4.

FIG. 7 is a graph of the sampling time versus the estimated frequency intensity of the laser cavity two-photon spectroscopy of FIG. 4. The estimated Allan deviation was deduced from a beat note measurement with two hand-sized Cs 6S→8S, F=3→F'''=3 transition stabilized lasers. The laser frequency instability is achieved of about $3 \times 10^{-13}$, or about 100 Hz, at a 400 s sampling time. Note that the data in FIG. 7 is just an estimated value because the lambda-type counter used in this system could not really provide appropriate sequences of frequency counting for directly deducing the Allan variance.

Reference is made back to FIG. 2. The two-photon hyperfine transition of Cs atoms is not only 6S→8S transition. In one or more embodiments, the 6S(1/2)→6D(3/2) transition, corresponding to absorb two 885.4 nm photons, and the 6S(1/2)→6D(5/2), corresponding to absorb two 883.7 nm photons, may be chosen. However, since the frequency of the photons in these two transitions may be affected by the magnetic field of environment, which is so called Zeeman effect, the laser cavity two-photon spectroscopy has to be further designed for these situations.

Figure 8:
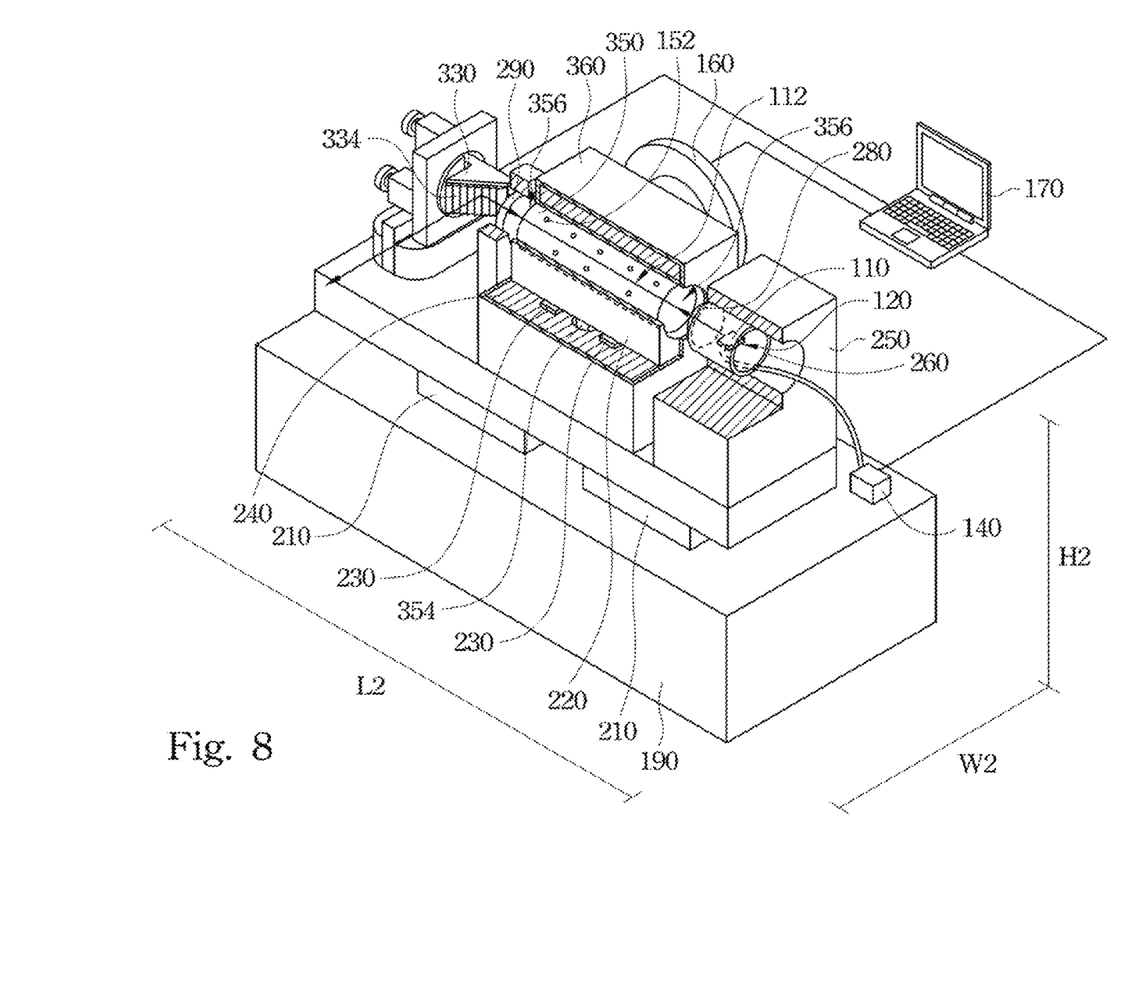
FIG. 8 is a schematic diagram of the laser cavity two-photon spectroscopy according to another embodiment.

FIG. 8 is a schematic diagram of the laser cavity two-photon spectroscopy according to another embodiment. A laser cavity two-photon spectroscopy includes a gain medium 110, a first reflector 120, a second reflector 330, an electrical pumping module 140, and a two-photon absorption cell 350. The first reflector 120 is disposed at a side of the gain medium 110. The second reflector 330 is movably disposed at a side of the gain medium 110 is relative to the first reflector 120. The electrical pumping module 140 is electrically connected to the gain medium 110, such that the gain medium 110 is able to emit a light beam. The light beam bounces back and forth between the first reflector 120 and the second reflector 330 and forms a laser beam 112 through enhanced by the gain medium 110. The two-photon absorption cell 350 is disposed between the gain medium 110 and the second reflector 130. The two-photon absorption cell 350 includes a plurality of two-photon absorption mediums 152. The two-photon absorption mediums 152 absorb a portion of the laser beam 112 reflected between the first reflector 120 and the second reflector 330 and then emit fluorescence.

A space between the first reflector 120 and the second reflector 330 functions as a laser cavity and also an accommodating space of the two-photon absorption cell 350. Since the absorption efficiency is substantially weak, even thought the two-photon absorption mediums 152 absorb the laser beam 112 and emit fluorescence, the two-photon absorption mediums 152 absorbed the laser beam 112 won't change the physical properties, such as refractive index, of the laser cavity. Therefore, the physical properties, such as frequency, of the laser beam 112 are not affected. In addition, for a laser device, there are about 90% laser power s reflected in the laser cavity, and only about 10% laser power emerges the laser device. Hence, the two-photon absorption cell 350 disposed in the laser cavity, i.e. the space between the first reflector 120 and the second reflector 330 in the present embodiment, meets higher laser power. On the other hand since the lasing of the laser cavity two-photon spectroscopy is obtained under high overlapping optical paths the laser beam 112 reflected respectively from the first reflector 120 and the second reflector 330, the lasing guarantees Doppler free of the two-photon absorption mediums 152. Moreover, since the two-photon absorption cell 350 is disposed in the laser cavity, the whole size of the laser cavity two-photon spectroscopy can be compacted, such as hand-sized. Thus, the cost of the laser cavity two-photon spectroscopy can be cost down, and it is convenience to move the whole laser cavity two-photon spectroscopy without any alignment.

The laser cavity two-photon spectroscopy may include a metal shell 360 covering the whole two-photon absorption cell 350 for isolating a magnetic field outside the two-photon absorption cell. In a real measurement, for the 6D(1/2)→6D(5/2) transition, the linewidth of the laser beam 112 was 1.2 MHz broadened without the metal shell 360.

The second reflector 330 may include a grating 334, which is properly oriented so that most of laser power can be diffracted back to the laser cavity for the wavelength of the laser beam 112. The gain medium 120 may be a diode laser, and hence the first reflector 120 is an end face of the diode laser. The two-photon absorption cell 350 can include two anti-reflecting (AR) coating windows 356 for reducing the light source from the two-photon absorption cell 350.

Similarly, the laser cavity two-photon spectroscopy also may further include at least one first temperature controlling device 210, a thermal conductor 220, at least one second temperature controlling device 230, a thermal isolation bulk 240. The first temperature controlling device 210 is utilized for controlling a temperature of the gain medium 110. The thermal conductor 220 is disposed around the two-photon absorption cell 350. The second temperature controlling device 230 is attached to the thermal conductor 220 for controlling a temperature of the two-photon absorption cell 350. The thermal isolation bulk 240 is disposed between the thermal conductor 220 and the first temperature controlling device 210. Furthermore, the laser cavity two-photon spectroscopy can further include a thermal reservoir 190 disposed on a side of the first temperature controlling device 210 for maintaining the temperature of the laser cavity two-photon spectroscopy.

In the present embodiment, two second temperature controlling devices 230 are attached to the thermal conductor 220. A cold finger 354 of the two-photon absorption cell 350 is disposed between the two second temperature controlling devices 230, such that the two second temperature controlling devices 230 can control the vapor pressure of Cs atoms in the two-photon absorption cell 350 through the cold finger 354. Two first temperature controlling devices 210 are disposed on the thermal reservoir 190, and the heat generated from the two first temperature controlling devices 210 can transfer to the diode laser (the gain medium 110). The thermal isolation bulk 240 is disposed between the first temperature controlling devices 210 and the thermal isolation bulk 220 to isolate the heats generated from the first temperature controlling devices 210 and the second temperature controlling devices 230. Therefore, the two-photon absorption cell 350 and the gain medium 110 can be at different temperatures and work well respectively.

In one or more embodiments, the laser cavity two-photon spectroscopy may further include a gain medium holder 250, a collimation tube 260, a first lens 270, and a second lens 290. The gain medium 110 is disposed in the collimation tube 260, and the collimation tube 260 is disposed in the gain medium holder 250. The first lens 270 is disposed in the collimation tube 260 and between the gain medium 110 and the two-photon absorption cell 350 for focusing the laser beam 112 reflected from the first reflector 120 into the two-photon absorption cell 350. On the other hand, the second lens 290 is disposed between the second reflector 130 and the two-photon absorption cell 350 for focusing the laser beam 112 reflected from the second reflector 130 into the two-photon absorption cell 350. It should be noticed that in FIG. 8, a portion of the thermal conductor 220, a portion of the thermal isolation bulk 240, a portion of the gain medium holder 250, a portion of the second lens 290, and a portion of the metal shell 360 have been removed to show the two-photon absorption cell 350, the second temperature controlling devices 230, the second lens 290, and the collimation tube 260 for clarify.

The laser cavity two-photon spectroscopy in the present embodiment can also be applied to the frequency calibration of a frequency stabilized laser. In one or more embodiments, the laser cavity two-photon spectroscopy may further include a light-collecting device 160 and a feedback module 170. The light-collecting device 160 is for collecting the fluorescence and analyzing the intensity of the fluorescence. The feedback module 170 is electrically connected to the second reflector 130 and/or the electrically pumping device 140 for tuning the frequency of the laser beam according to the fluorescence intensity. Therefore, the two-photon absorption cell 350, the light-collecting device 160, and the feedback module 170 can be a frequency calibration system of the frequency stabilized laser.

In specifically, when the frequency of the laser beam 112 is around 884 nm, the two-photon absorption mediums 152 can absorb the laser beam 112 and emit fluorescence. The light-collecting device 160 collects the fluorescence and gets an absorption spectrum. The intensity of the fluorescence is demodulated to be a first derivative signal. The feedback module 170 is then tuning the frequency of the laser beam 112 according to the first derivative signal. The frequency of the laser beam 112 is not locked until the frequency of the laser beam 112 matches the absorption frequency of the two-photon transition. On the other hand, to collect higher intensity of the fluorescence, an inner wall of an entrance of the light-collecting device 160 may be coated a reflecting layer, such that the fluorescence can be reflected into the light-collecting device 160 efficiently.)

Figure 9:
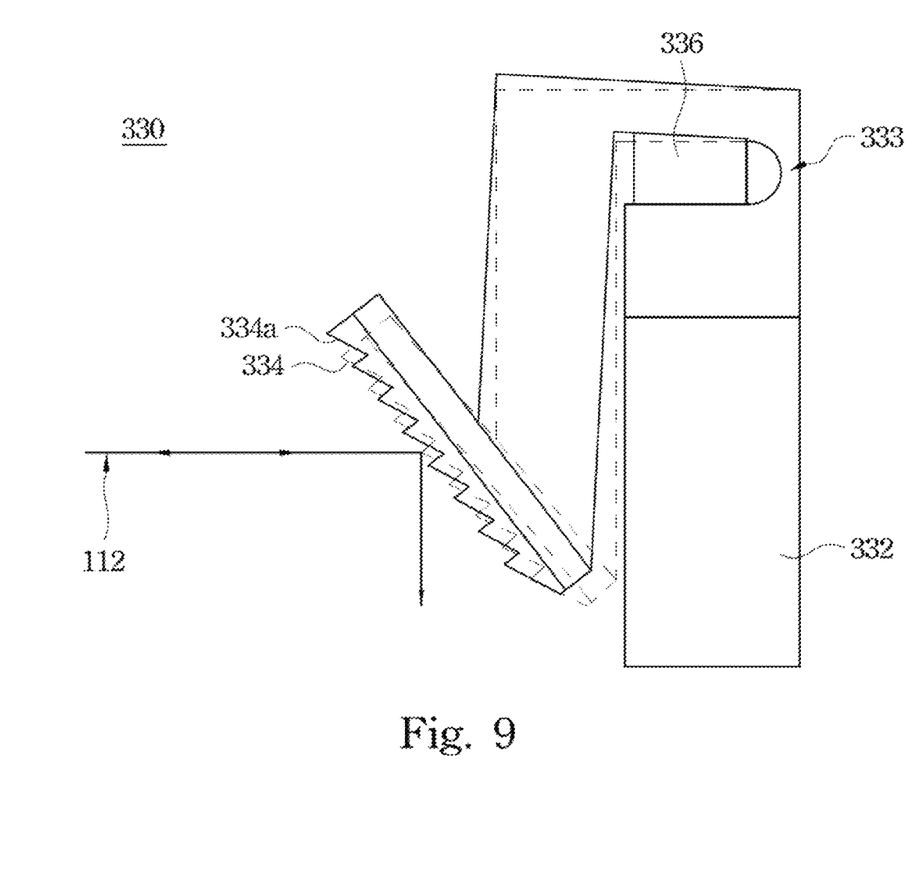
FIG. 9 is a schematic diagram of the second reflector in FIG. 8.

FIG. 9 is a schematic diagram of the second reflector 330 in FIG. 8. In one or more embodiments, the feedback module 170 in FIG. 8 can feedback the frequency tuning signal to the second reflector 330. The second reflector 330 includes a base 332, the grating 334, and a piezo-electric material 336. The base has a pivot 333, and the grating 334 is fixed to the base 332. The piezo-electric material 336 is disposed in the base 332 and electrically connected to the feed back module 170 in FIG. 8 for turning the grating 334 relative to the base 332. The laser beam 112 is incident to and reflected from the grating 334. For tuning the frequency of the laser beam 112, the feedback module 170 provides voltage to the piezo-electric material 336. Therefore, the length of the piezo-electric material 336 is changed, i.e. the length is longer as shown in FIG. 9 for example. The size-changed piezo-electric material 336 then push the base 332 along the pivot 333, and the angle and the position of the grating 334 are both changed to be the grating 334a to tune the frequency of the laser beam 312. It should be understood, the structure of the second reflector 330 with the size-unchanged piezo-electric material 336 is shown as dashed lines in FIG. 9, while the structure of the second reflector 330 with the size-changed piezo-electric material 336 is shown as solid lines in FIG. 9 for clarity.

Reference is made back to FIG. 8. On the other hand, the frequency of the laser beam 112 can be tuned by changing the driving current of the gain medium 110. The feedback module 170 may apply the frequency tuning signal to the electrical pumping module 140 for tuning the driving current of the gain medium 110. Since the reflective index of the gain medium 110 is slightly changed under different driving currents, the frequency of the laser beam 112 is also tuned by applying different driving currents. It should be understood that the frequency of the laser beam 112 can be tuned by tuning both or either the driving current and the current of the piezo-electric material in FIG. 9.

Figure 10:
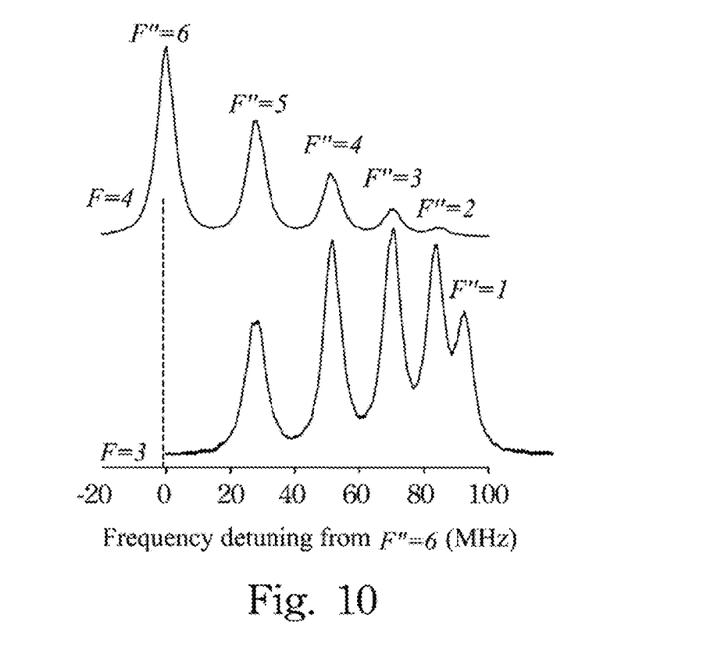
FIG. 10 is an absorption spectrum of Cs atoms 6S(1/2)→6D(5/2) (F=3→F''=1~6 and F=4→F''=1~6) hyperfine transmissions measured using the laser cavity two-photon spectroscopy of FIG. 8 according to an example.
Figure 11:
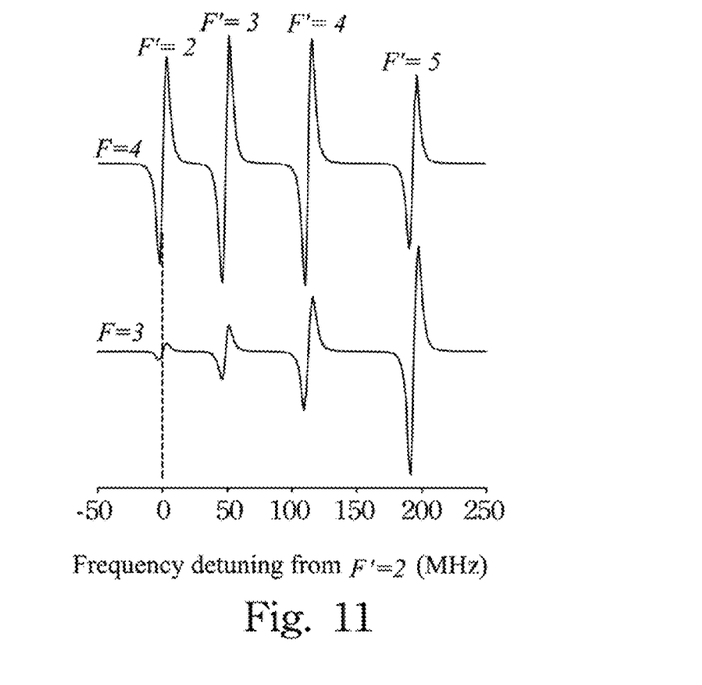
FIG. 11 is a first derivative signals of Cs atoms 6S(1/2)→6D(3/2) (F=3→F''=2~5 and F=4→F''=2~5) hyperfine transmissions measured using the laser cavity two-photon spectroscopy of FIG. 8 according to an example.

References are made to FIG. 10 and FIG. 11. FIG. 10 is an absorption spectrum of Cs atoms $6S(1/2) \rightarrow 6D(5/2)$ ($F=3 \rightarrow F''=1\sim6$ and $F=4 \rightarrow F'=1\sim6$) hyperfine transmissions measured using the laser cavity two-photon spectroscopy of FIG. 8 according to an example. FIG. 11 is a first derivative signals of Cs atoms $6S(1/2) \rightarrow 6D(3/2)$ ($F=3 \rightarrow F'=2\sim5$ and $F=4 \rightarrow F'=2\sim5$) hyperfine transmissions measured using the laser cavity two-photon spectroscopy of FIG. 8 according to an example. The size ($L2 \times W2 \times H2$) of the laser cavity two-photon spectroscopy was $18.5 \times 9 \times 6.8$ cm$^3$. The gain medium was an 884 nm Ti:sapphire diode laser (AR coated) with 40 mW output power, and the first reflector was an end face of the diode laser. The grating of the second reflector was with 1800 groove/mm, and about 45% of laser power could be diffracted back to the laser cavity. The laser power inside the laser cavity was estimated as 18 mW. The two-photon absorption mediums were Cs atoms. The temperatures of the diode laser and the two-photon absorption cell were 23° C. and 100° C., respectively, and all within a range of 1 mK temperature instability. The power intensity inside the two-photon absorption cell was about 35 mW/mm$^2$. The absorption signal of Cs atoms was collected by using a photomultiplier tube (PMT).

The best signal to noise ratio (SNR) of all transitions was similar, and all good for laser stabilization. The two-photon absorption signals (from a lock-in amplifier) in which chopping fluorescence was realized by modulating the driving current of the diode laser with a 30 kHz square wave, resulting in a 50 MHz optical frequency jump between the absorption center and the nonfluorescence region. Because the high resolution, some spectra were clearly resolved for the first time, namely, F=4→F"=2 and F=3→F"=1 of 6S(1/2)→6D(5/2). Since the absolute frequencies of all transitions in the 6S(1/2)→6D(3/2) and 6S(1/2)→6D(5/2) transition groups were not measured, the frequency axes of FIG. 10 and FIG. 11 were calibrated to transition resonances of the largest SNR in their group. For example, the F"=6 transition is chosen for the frequency axis reference of 6S(1/2), F=4→6D(5/2) group of FIG. 10, and the F'=2 transition is chosen for the frequency axis reference of 6S(1/2), F=4→6D(3/2) group of FIG. 11. On the other hand, for the 6S(1/2), F=3→6D(3/2) transition, the measured frequency difference between F'=2 and F'=3 was 49.1108 MHz, the measured frequency difference between F'=3 and F'=4 was 65.36303 MHz, and the measured frequency difference between F'=4 and F'=5 was 81.69007 MHz. For the 6S(1/2), F=4→6D(3/2) transition, the measured frequency difference between F=2 and F'=3 was 49.23434 MHz, the measured frequency difference between F'=3 and F'=4 was 65.37121 MHz, and the measured frequency difference between F'=4 and F'=5 was 81.69037 MHz.

In FIG. 10, the peaks, i.e. the transition resonances of two-photon absorptions, of the absorption spectra correspond to the frequency of the two photons absorbed by the Cs atoms. Since the transition resonances are even symmetry respect to each absorption peak, it is hard to decide the frequency tuning direction of the laser beam. However, as shown in FIG. 11, after first derivating the absorption spectra, the transition resonance becomes odd symmetry respect to each absorption peak, which gives a direction to tune the frequency of the laser. In addition, thanks to the higher SNR of the signals measured by using the laser cavity two-photon spectroscopy in the embodiments mentioned above, the frequency calibration of the frequency stabilized laser can be more precise. After calibrating the frequency, the laser frequency of the frequency stabilized laser can further compare with a laser comb to obtain the absolute laser frequency of the frequency stabilized laser.

It will be apparent to those skilled in the art that various modifications and variations can be made to the structure of the present invention without to departing from the scope or spirit of the invention. In view of the foregoing, it is intended that the present invention cover modifications and variations of this invention provided they fall within the scope of the following claims.

What is claimed is:

1. A laser cavity two-photon spectroscopy, comprising:
a collimation tube;
a gain medium disposed in the collimation tube;
a first reflector, disposed at a side of the gain medium;
a second reflector movably disposed at a side of the gain medium relative to the first reflector;
an electrical pumping module electrically connected to the gain medium, such that the gain medium is able to emit a light beam, and the light beam bounces back and forth between the first reflector and the second reflector and forms a laser beam through enhanced by the gain medium;
a two-photon absorption cell disposed between the gain medium and the second reflector, wherein the two-photon absorption cell comprises a plurality of two-photon absorption mediums, the two-photon absorption mediums absorb a portion of the laser beam reflected between the first reflector and the second reflector and then emit fluorescence; and
a first lens disposed in the collimation tube and between the gain medium and the two-photon absorption cell for focusing the laser beam into the two-photon absorption cell.

2. The laser cavity two-photon spectroscopy of claim 1, further comprising;
a light-collecting device for collecting the fluorescence and analyzing the intensity of the fluorescence; and
a feedback module electrically connected to the second reflector for tuning the frequency of the laser beam according to the fluorescence intensity.

3. The laser cavity two-photon spectroscopy of claim 2, wherein the second reflector comprises:
a base having a pivot;
a grating fixed to the base; and
a piezo-electric material disposed in the base and electrically connected to the feedback module for turning the grating relative to the base.

4. The laser cavity two-photon spectroscopy of claim 1, further comprising:
a light-collecting device for collecting the fluorescence and analyzing the intensity of the fluorescence; and
a feedback module electrically connected to the electrically pumping device for tuning the frequency of the laser beam according to the fluorescence intensity.

5. The laser cavity two-photon spectroscopy of claim 1, wherein the two-photon absorption mediums are alkali atoms.

6. The laser cavity two-photon spectroscopy of claim 1, further comprising:
at least one first temperature controlling device for controlling a temperature of the gain medium;
a thermal conductor disposed around the two-photon absorption cell;
at least one second temperature controlling device attached to the thermal conductor for controlling a temperature of the two-photon absorption cell; and
a thermal isolation bulk disposed between the thermal conductor and the first temperature controlling device.

7. The laser cavity two-photon spectroscopy of claim 6, wherein the first temperature controlling device is a thermoelectric cooler.

8. The laser cavity two-photon spectroscopy of claim 6, wherein the second temperature controlling device is a thermally sensitive resistance.

9. The laser cavity two-photon spectroscopy of claim 6, further comprising:
a thermal reservoir disposed on a side of the first temperature controlling device for maintaining the temperature of the laser cavity two-photon spectroscopy.

10. The laser cavity two-photon spectroscopy of claim 1, further comprising:

a metal shell covering at least a portion of the two-photon absorption cell for isolating a magnetic field outside the two-photon absorption cell.

11. The laser cavity two-photon spectroscopy of claim 1, wherein the two-photon absorption cell comprises two anti-reflecting-coated windows for reducing the light loss from the two-photon absorption cell.

12. The laser cavity two-photon spectroscopy of claim 1, wherein the two-photon absorption cell comprises two Brewster windows for reducing the light loss from the two-photon absorption cell.

13. The laser cavity two-photon spectroscopy of claim 1, further comprising a damping substrate for bearing the first reflector, the second reflector, the gain medium, and the two-photon absorption cell, and reducing oscillations of the first reflector, the second reflector, the gain medium, and the two-photon absorption cell.

14. The laser cavity two-photon spectroscopy of claim 13, further comprising a gain medium holder with a bump, wherein the gain medium is disposed in the gain medium holder, and the damping substrate has a groove being able to couple to the bump.

15. The laser cavity two-photon spectroscopy of claim 1, further comprising a second lens disposed between the two-photon absorption cell and the second reflector.

* * * * *